(12) United States Patent
El-Ghoroury

(10) Patent No.: US 7,055,019 B2
(45) Date of Patent: May 30, 2006

(54) MATCHED INSTRUCTION SET PROCESSOR SYSTEMS AND METHOD, SYSTEM, AND APPARATUS TO EFFICIENTLY DESIGN AND IMPLEMENT MATCHED INSTRUCTION SET PROCESSOR SYSTEMS BY MAPPING SYSTEM DESIGNS TO RE-CONFIGURABLE HARDWARE PLATFORMS

(75) Inventor: Hussein S. El-Ghoroury, Carlsbad, CA (US)

(73) Assignee: Ellipsis Digital Systems, Inc., Carlsbad, CA (US)

( * ) Notice: Subject to any disclaimer, the term of this patent is extended or adjusted under 35 U.S.C. 154(b) by 815 days.

(21) Appl. No.: 10/074,455

(22) Filed: Feb. 11, 2002

(65) Prior Publication Data

US 2002/0116165 A1    Aug. 22, 2002

Related U.S. Application Data

(60) Provisional application No. 60/268,827, filed on Feb. 13, 2001.

(51) Int. Cl.
*G06F 9/30* (2006.01)
(52) U.S. Cl. ...................... 712/203; 712/200
(58) Field of Classification Search .............. 703/14; 712/200, 203, 220, 232, 21, 22, 24

See application file for complete search history.

(56) References Cited

U.S. PATENT DOCUMENTS

| 4,926,323 | A | * | 5/1990 | Baror et al. ................. 712/238 |
| 5,623,684 | A |   | 4/1997 | El-Ghoroury et al. |
| 5,867,400 | A |   | 2/1999 | El-Ghoroury et al. |
| 6,021,469 | A | * | 2/2000 | Tremblay et al. ............ 711/125 |
| 6,085,307 | A | * | 7/2000 | Evoy et al. .................... 712/31 |
| 6,324,638 | B1 | * | 11/2001 | Elmer et al. .................. 712/17 |
| 6,446,195 | B1 | * | 9/2002 | Ganapathy et al. ......... 712/221 |

FOREIGN PATENT DOCUMENTS

| EP | 1 065 611 A2 | 1/2001 |
| WO | WO - 95/31778 | 11/1995 |
| WO | WO - 00/38087 | 6/2000 |

* cited by examiner

*Primary Examiner*—Albert W. Paladini
(74) *Attorney, Agent, or Firm*—Blakely Sokoloff Taylor & Zafman

(57) ABSTRACT

This invention relates to matched instruction set processor systems and a method, system, and apparatus to efficiently design and implement matched instruction set processor systems by mapping system designs to re-configurable hardware platforms. The method includes decomposing the matched instruction set processor system into interconnected design vectors, each of the interconnected design vectors including a binding header method, a run method, a conjugate virtual machine (CVM), a binding trailer method, and an invocation method. The method also includes analyzing and mapping the interconnected design vectors into a re-configurable platform.

23 Claims, 9 Drawing Sheets

130

```
/** Vector Attributes */
string vectorName;    135
string vectorType;    140
string parentAS;      145
```

```
/** Header variables */
// Add input variable declarations
Object headerVar[];    155
/** Trailer variables */
// Add output variable declarations
Object trailerVar[];
                      160
```

Figure 3C

```
/** Vector Constructor Method: Construct an actor with the given vector name */
public udmVectorClassName (string vectorName, udmVector inVector[], udmVector
outVector[])
    {   // Call constructor in base class
        super(vectorName, parentAS, inVector, outVector);
        // Perform any initialization that needs to be done in the constructor
    }

/** This method contains the actual behavior of the vector */
    private boolean vectorRun()
    {
        // Perform the vector processing
        return true;   // (or false if you want to terminate the thread)
    }

/** This is the invocation method that checks to see if the vector is ready to run */
    private void vectorInvocation()
    {
        while ( !headerDataReady() ) vectorWait();
    }

/** Get the header input data */
    private void getHeaderInput()
    {
        // Get input data from interconnect vector
        headerData = vectorGet();
    }

/** Send the trailer output data */
    private void sendTrailerOutput()
    {
        // Send output data to the interconnect vector
        vectorSend( trailerData );
    }

/** run is the method that is started by Java when the thread is started */
    public void run()
    {
        boolean runThread = true;

// Initialize the vector
        initialize();
        while ( runThread )
        {
            // Call invocation method
            vectorInvocation();

// Get input data
            getHeaderInput();

// Do the processing for the vector
            runThread = vectorRun();

// Send output data
            sendTrailerOutput();
        }

// Perform final cleanup before vector thread exits
        wrapup();
    }
```

Figure 3D

MATCHED INSTRUCTION SET PROCESSOR SYSTEMS AND METHOD, SYSTEM, AND APPARATUS TO EFFICIENTLY DESIGN AND IMPLEMENT MATCHED INSTRUCTION SET PROCESSOR SYSTEMS BY MAPPING SYSTEM DESIGNS TO RE-CONFIGURABLE HARDWARE PLATFORMS

RELATED APPLICATION

This application claims the benefit of U.S. Provisional Patent Application No. 60/268,827 filed on Feb. 13, 2001.

BACKGROUND (1) Field

This invention relates to matched instruction set processor systems and a method, system, and apparatus to efficiently design and implement matched instruction set processor systems by mapping system designs to re-configurable hardware platforms.

(2) General Background

Traditional Application Specific Integrated Circuit (ASIC) design methods and the "Fabless Integrated Circuit (IC)" business model have worked well for the personal computer (PC) industry for many reasons. The primary reason is that PC design requirements typically do not radically change from one product to another. In comparison, the wide spread proliferation and constant evolution of the communications standards cause product design requirements of digital communication products to significantly change from one product to the next product. As a result, the overhead resulting from applying ASIC design methods and the "Fabless IC" business model to Digital Communications products are far more excessive.

Generally, the value that a typical digital communication semiconductor company following the "Fabless IC" business model offers is concentrated in the design content of the IC. Typically, the semiconductor technology offered by many fabless semiconductor companies is merely a redesign and re-packaging of components that the companies have previously designed. These fabless companies generally expend disproportional monetary and human resources to re-package various communication components to produce products. Therefore, chip design cycles normally assume a substantial portion of the total cost of final products.

There are several other significant shortcomings of the "Fabless IC" business model and ASIC design methods when applied to the development of digital communication products. These shortcomings arise basically from the fact that the implementation of digital communication products typically includes embedded software that is not well integrated into the design process. Some exemplary shortcomings may include:

Lack of a unified hardware (HW) and software (SW) design approach, leading to difficulties in verifying the integrated design, and hence incompatibilities across the hardware and software boundary.

Tendency to define a priori a partitioning of hardware and software, leading to rigid and sub-optimal designs.

Lack of well-defined design flow, making specification revision difficult and hence impacting time-to-market.

Lack of built-in techniques within the design process to promote reusability and portability, preventing timely reaction to market trends and leading to the inability to leverage attained market position.

As a result, it is desirable to have a new approach to communication processor design and design methodology that could overcome the aforementioned shortcomings and that is more compatible with the market evolution cycles in the digital communication semiconductor industry.

BRIEF DESCRIPTION OF THE DRAWINGS

FIG. 3B shows an exemplary set of Vector Attributes in accordance with one embodiment of the present invention.

FIG. 3C shows exemplary variables definitions in accordance with one embodiment of the present invention.

FIG. 3D shows exemplary Methods of an exemplary UDM Design Vector in accordance with one embodiment of the present invention.

DETAILED DESCRIPTION OF THE INVENTION

Figure 1A:
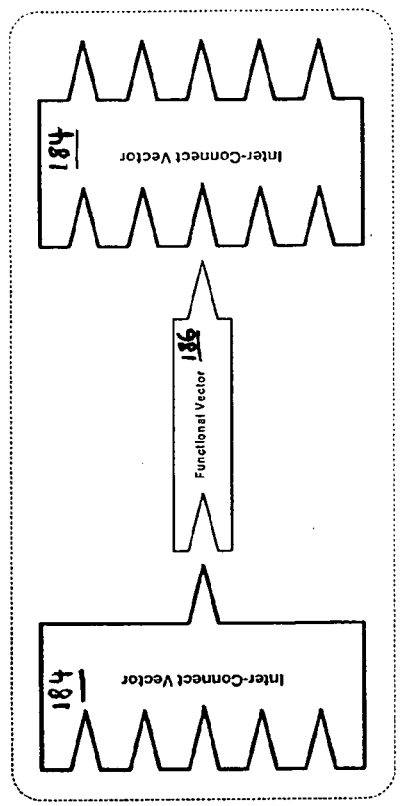
FIG. 1A illustrates two exemplary types of Vectors in accordance with one embodiment of the present invention.

This invention relates to matched instruction set processor systems and a method, system, and apparatus to efficiently design and implement matched instruction set processor systems by mapping system designs to re-configurable hardware platforms.

Virtual Integrated Circuits (IC) are generally IC products whereby both of the software as well as the hardware aspects of the product are unified into a seamless architecture. Soft Products are generally Virtual Integrated Circuits designed to address a specific application but not targeting a specific hardware technology, platform or semiconductors technology and can be realized into an Application Specific Standard Product (ASSP) or run on a re-configurable hardware Platform.

The Virtual IC design method and business model can overcome many of the shortcomings of the "Fabless IC" model. In the Virtual IC model both of the software as well as the hardware aspects of the product design are unified into a seamless and unified design method. Furthermore, the hardware and software design aspects remain unified until the latter stages of the design are reached, thus allowing maximum flexibility to alter the functional allocation and partition between the hardware and the software aspects.

In the Virtual IC model, the design is not committed to a specific hardware architecture, technology or foundry. Rather, the overall product design is verified and validated against the product design requirements then ported to the desired hardware architecture, the preferred technology and target foundry. This front-end design process independence prevents the dilution of the product designers' value-added encountered in the Fabless IC model while retaining the flexibility to port the design to any desired hardware architecture, technology or foundry. Furthermore, the decoupling of the chip design from the product design frees hardware designers to evolve and eventually replace their designs without perturbing legacy product designs.

In the Virtual IC model, design modularity is an integral attribute of the design and is incorporated at the onset of the design process. The design modularity in the Virtual IC model is done in such a way that any single module can be committed to either hardware or software implementation and can be reused from one product realization to another. In effect the design modularity provisions in the Virtual IC model allows hardware/software partition flexibility as well as reusability.

In summary, the Virtual IC model attains maximum efficiency for Digital Communication products through Portability across hardware platforms and Reusability across digital communication standards.

Matched Instruction Set Processors are generally processors that can be adapted or reconfigured to support a variety of base instruction sets. These processors can be matched to individual tasks that a communication processor is expected to perform. As a result Matched Instruction Processors are good candidates for implementing communication processors targeted to changing communication applications and standards. As such, Matched Instruction Set Processors support reconfigurable computing architectures, thereby enabling adaptation of hardware resources to perform a specific computation. Reconfigurable computing architectures can provide an alternate paradigm to utilize the available logic resources on the chip. For several classes of applications (including digital communication applications), Matched Instruction Set Processors that support reconfigurable computing architectures could provide power optimization, cost reduction, and enhanced run-time performance.

Matched Instruction Set Processors are made up of specific hardware and software objects or elements. These processors can be described as multiple parallel-processing pipelines that contain interconnected Functional and Interconnection Vectors, with each of the Application Models corresponding to one or more Vectors.

In one embodiment, each parallel-processing pipeline can contain one or more Functional Vectors and/or Interconnect Vectors. A Vector can be generally defined as a portion of a processing pipeline that requires no further parallelism. A Functional Vector generally contains design information for one or more functional aspects of the processing pipeline. An Interconnect Vector generally contains design information for connectivity characteristics.

FIG. 1A illustrates two exemplary types of Vectors in accordance with one embodiment of the present invention. Vectors are the most basic building blocks with which the terminal architectural model can be constructed. As shown in FIG. 1A, two exemplary types of Vectors include Functional Vectors 186 and Interconnect Vectors 184. In one embodiment, each Functional Vector 186 can be dedicated to performing a single function of transforming the input variables into the output variables. It should be noted that Functional Vectors 186 could be restricted to receive their input variables from a single Interconnect Vector and deliver their output variables to a single Interconnect Vector.

In one embodiment, Interconnect Vectors 184 can be used to provide the interconnectivity between Functional Vectors 186. Each Interconnect Vector 184 can typically perform the functions required to contain and transport shared and global variables between Functional Vectors 186. If an Interconnect Vector 184 interconnects two Functional Vectors 186, variables exchanged between the two Functional Vectors 186 are shared variables. If an interconnect vector transports variables between more than two Functional Vectors 186, the transported variables are global variables.

Figure 1B:
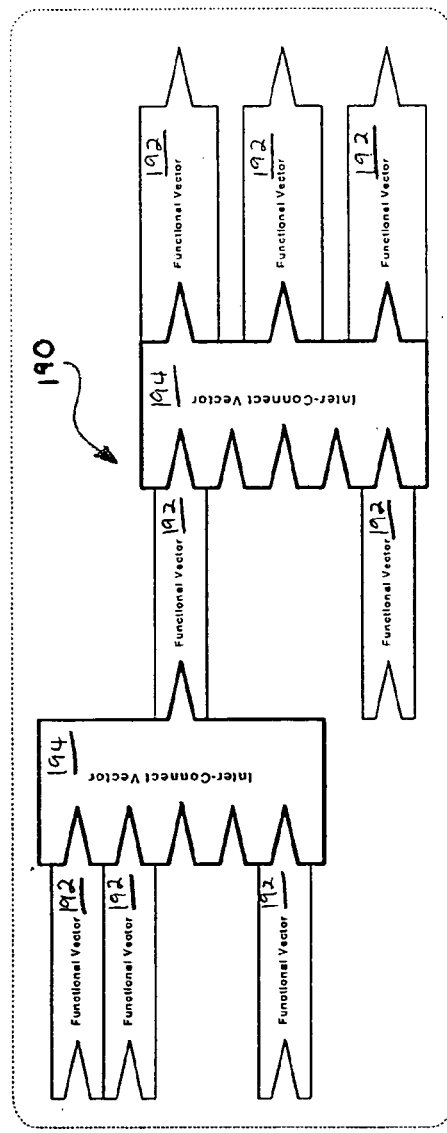
FIG. 1B shows an exemplary Terminal Architectural model expressed in terms of a set of interconnected Functional Vectors in accordance with one embodiment of the present invention

FIG. 1B shows an exemplary Terminal Architectural model 190 that is expressed in terms of a set of interconnected Functional Vectors 192 in accordance with one embodiment of the present invention. Interconnect Vectors 194 are used to link or interconnect the Functional Vectors 192. As previously stated, Interconnect Vectors 194 and Functional Vectors 192 represent the lowest level of building blocks that will be used in building the terminal Architectural model. Each Vector is implemented by a Scaled Virtual Machine supporting the required computing capabilities. Examples of computing capabilities or features may include an instruction set, processing throughput requirement, memory requirement, etc. A Scaled Virtual Machine generally includes computing capabilities or features that represent a truncation or extension of pre-determined computing capabilities or features of a default virtual machine.

In one embodiment, the Java Virtual Machine (JVM) is used to implement the default virtual machine. In this embodiment, capabilities or features of the default virtual machine or the JVM can be extended or truncated to define an instance of the Scaled Virtual Machine that could meet the computing capabilities or features required by the Vector.

We will now describe the methodology to produce the aforementioned Matched Instruction Set Processor Architecture.

Figure 2:
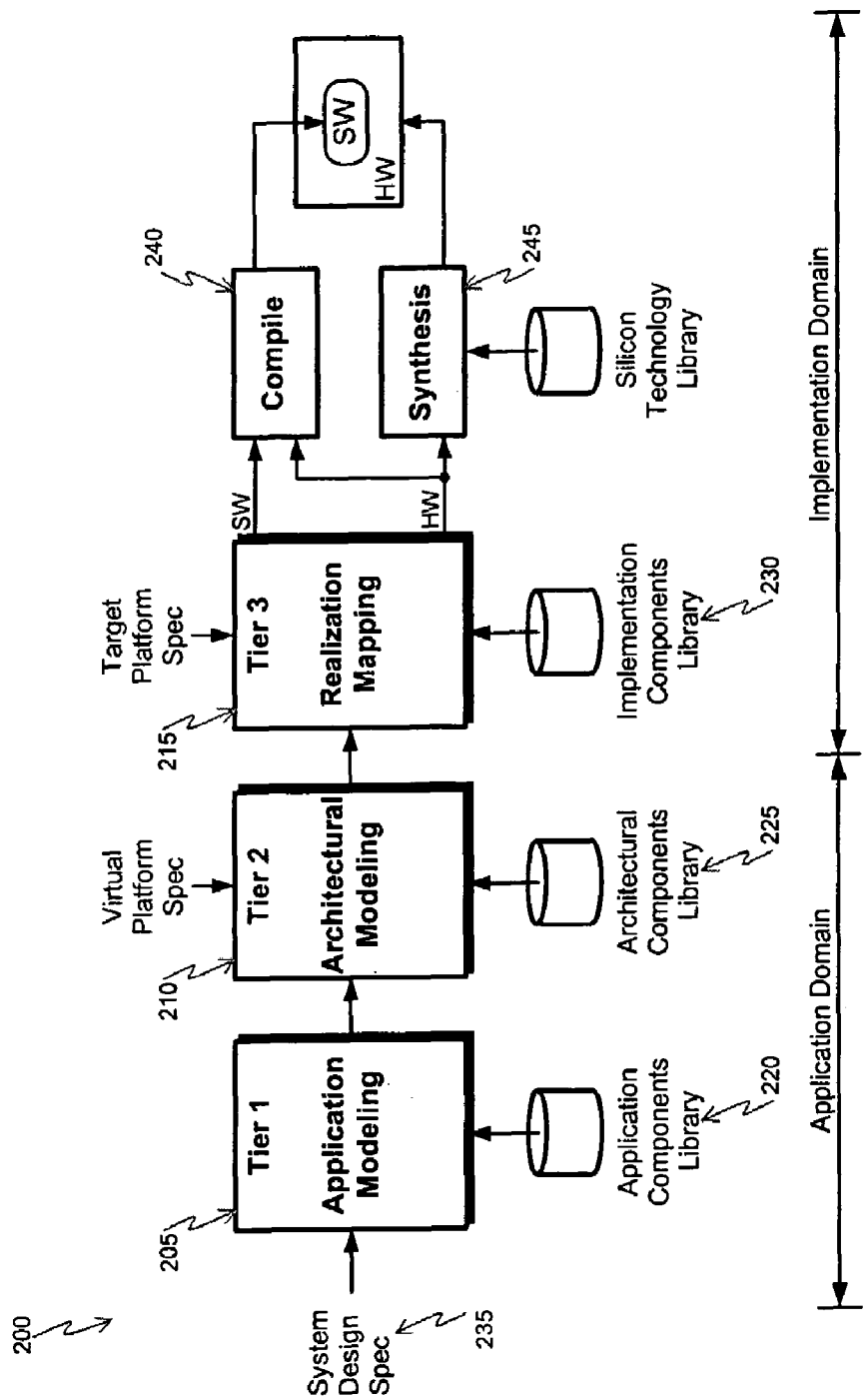
FIG. 2 is a diagram showing a plurality of exemplary tiers or stages in the Unified Design Methodology (UDM) in accordance with one embodiment of the present invention.

FIG. 2 is a diagram showing a plurality of exemplary tiers or stages 205, 210, 215 in the Unified Design Methodology (UDM) 200 in accordance with one embodiment of the present invention. The Unified Design Methodology 200 generally includes multiple tiers or stages 205, 210, 215. In each tier or stage 205, 210, 215, a different set of tasks is performed.

The Unified Design Methodology 200 generally provides an efficient technique to efficiently design and implement Matched Instruction Set Processors applicable to Virtual IC in general and digital communication Virtual IC in specific. Furthermore, the Unified Design Methodology 200 can enable the development of cost-effective digital communication Virtual IC products by incorporating all of the software as well as the hardware design aspects of the product and can be independently realized into a target hardware architecture, platform, or technology.

The Unified Design Methodology 200 is generally based on a multi-tier or multi-stage approach with each tier or stage 205, 210, 215 being supported by a corresponding design library 220, 225, 230. The Methodology 200 generally maps system design specifications 235 into hardware and software designs while allowing the incorporation of a preferred hardware specifications and constraints. Allocation or mapping of the system design to hardware and software is performed at the latter stages 240, 245 of the Methodology 200. Therefore, the overall system design can be verified before being committed, allocated, or mapped to actual hardware and software platforms. Thus the Methodology 200 allows the system design to be substantially independent of hardware platform and semiconductors technology. As a result, the resulting system design and its constituent elements can be realized using any preferred hardware platform and semiconductors technology.

In general, an Application Analysis of the system design flow is performed in Tier 1 205 to ensure compliance with system design specifications 235. The process of ensuring compliance with system design specifications 235 is called Application Verification.

In Tier 1 205, system design specifications 235 are analyzed and mapped into one or more Application Components. Appropriate pre-existing Application Components can be extracted from an Application Components Library 220, modified (if required) to be compatible with system design specifications 235, and incorporated into the system design flow. System design requirements, including processing and timing requirements, can also be allocated or mapped to the Application Components.

Each Application Component generally represents a reusable function commonly used in digital communication systems. A Functional Element generally represents a group of related functions, each of which performing specific tasks common to digital communication systems. Accordingly, each Functional Element can be composed of a group of interconnected Application Components.

The result of Tier 1 205 is generally an Application Model that can be used to verify compliance with system design specifications 235. As a result, engineering designers can think in high-level abstraction. It should be noted that no specific assumption is made in Tier 1 205 regarding the allocation of the system design specifications 235 and requirements into hardware and software. It should also be noted that Application Components residing in the Application Components Library 220 could be defined in a manner that will promote and enable reusability of the modules across various different digital communication standards.

If the Application Component generated in Tier 1 205 is a newly defined component, Architectural Components corresponding to the newly defined Application Component may need to be generated. To generate corresponding Architectural Components, a newly defined Application Component is first decomposed into one or more parallel processing pipelines in order to satisfy system processing and timing requirements.

Each parallel-processing pipeline can be further decomposed further into one or more Functional and Interconnect Design Vectors. A Design Vector can be generally defined as a portion of a processing pipeline that requires no further parallelism. A Functional Design Vector generally contains design information for one or more functional aspects of the processing pipeline. An Interconnect Design Vector generally contains design information for connectivity characteristics.

After each parallel-processing pipeline has been decomposed into one or more Design Vectors, the design of system can be represented by a set of interconnected Functional and Interconnection Design Vectors, with each Application Component generated in Tier 1 corresponding to one or more Design Vectors generated in Tier 2.

The processing requirements of each Design Vector can then be analyzed to determine computing capabilities or features that are needed to support the Design Vector. Examples of computing capabilities or features may include an instruction set, processing throughput requirement, memory requirement, etc. The required computing capabilities or features of each Design Vector can then be used to define a Scaled Virtual Machine. Thus, a Scaled Virtual Machine generally includes computing capabilities or features that represent a truncation or extension of pre-determined computing capabilities or features of a default virtual machine.

In one embodiment, the Java Virtual Machine (JVM) is used to implement the default virtual machine. In this embodiment, capabilities or features of the default virtual machine or the JVM can be extended or truncated to define an instance of the Scaled Virtual Machine that could meet the computing capabilities or features required by the Design Vector.

Figure 3A:
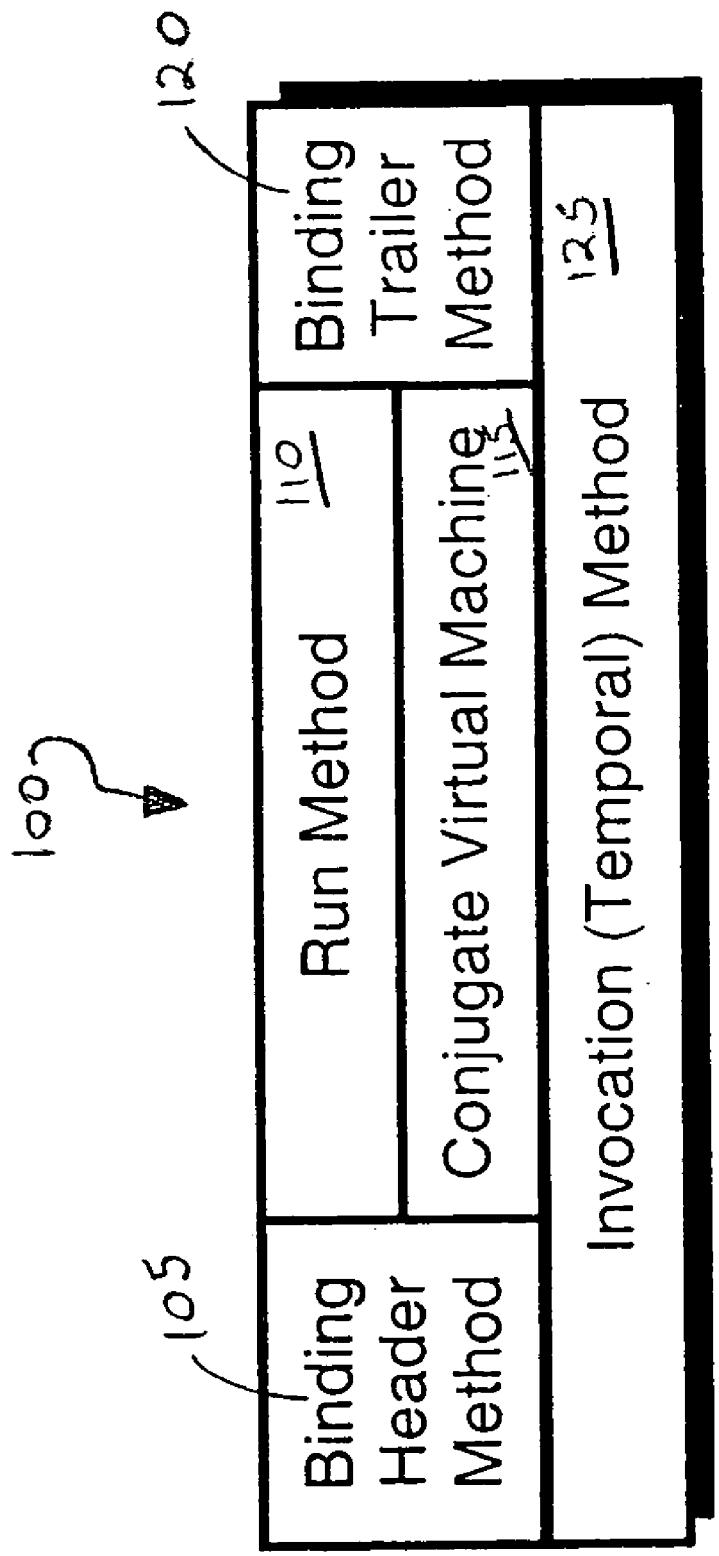
FIG. 3A illustrates the overall structure of an exemplary UDM Design Vector in accordance with one embodiment of the present invention.

FIG. 3A illustrates the overall structure of an exemplary UDM Design Vector 200 in accordance with one embodiment of the present invention. The exemplary UDM Design Vector 200 can contain Run Method 210 and a definition of the "Matched" execution engine hardware, referred to as a Conjugate Virtual Machine (CVM) 215. Hence, the UDM Design Vector 200 can be represented as a software module executing on its own virtual (hardware) processor referred to as CVM. Header 205 and Trailer 220 contain the binding methods that connect the Design Vector 200 to other Design Vectors. Run Method 210 generally contains the behavior of the Design Vector 200.

In one embodiment, the Run Method 210 can include a Java software module that describes the processing to be performed by the UDM Design Vector 200. Temporal 225 typically contains the invocation method of the Design Vector. CVM 215 generally contains the description of the execution engine, which can be the JVM instruction subset that is needed to support the execution of the Run Method 210.

In one embodiment, the Header 205 generally contains the description of the input variables and the UDM Design Vectors that produce the input variables. In this embodiment, the Trailer 220 generally contains the description of the output variables and the UDM Design Vectors destined to receive the output variables.

In addition, the UDM Design Vectors 200 use the following types of Header and Trailer variables, including Local Variables, Shared Variables, and Global Variables. Local Variables are generally local within an UDM Design Vector. Shared Variables are typically shared between two Functional Design Vectors. Global Variables can be shared between several Functional Design Vectors.

Shared Variables and Global Variables can be accessed by multiple Design Vectors, and hence can be used to pass data between Design Vectors. Shared Variables and Global Variables are defined in the Header 205 and Trailer 220 of the Design Vector 200. Synchronization of access to Shared & Global Variables is performed data synchronization mechanisms provided by the selected design language. Examples of data synchronization mechanisms can include "wait( )" and "notify( )" methods, as defined by the Java programming language.

Temporal information 225 contains the invocation information and the maximum allowable response time within which the Design Vector 200 must complete its processing.

Conjugate Virtual Machine (CVM) field 215 generally includes design information describing required computing capabilities or features of the Scaled Virtual Machine that are minimally sufficient to execute the sequence of operations described in the Method field 210. Later in the Unified Design Methodology 100 (shown in FIG. 2), the realization of the Scaled Virtual Machine as described in the CVM field 215 can be committed to either hardware or software depending upon the specified capabilities of a preferred platform 150 (shown in FIG. 2). In one embodiment, the programming language can correspond to the default CVM that is being used. For example, the Java programming language would be used if the default virtual machine were a Java Virtual Machine (JVM). In this embodiment, the CVM describes the hardware that is the matched subset of the JVM instruction set generated by compiling the Design Vector Run Method.

A JVM generally refers to a computing machine designed to run Java programs. The computing machine is defined by the Java Virtual Machine Specification, which encompasses topics such as the format of Java class files and the semantics of each instruction. Implementations of the JVM Specification are needed to support the defined semantics correctly. Implementations of the JVM Specification are also known as Java runtime systems.

Returning to FIG. 2, the design of the system can be decomposed into a collection of interconnected Design Vectors in Tier 2 210 of the Unified Design Methodology 200 to fully capture hardware and software design aspects or features of the system. As stated above, the design information or specification of each interconnected Design Vector can be captured in a UDM Design Vector 200, as shown in FIG. 3A and described in the text accompanying the figure. Therefore, the collection of Design Vectors may be thought of as a detailed design that captures hardware and software design aspects or features of the system.

As stated above, each interconnected Design Vector can be either a Functional Design Vector or an Interconnect Design Vector. In either case, the design of each Design Vector can be described using any design language. In one embodiment, the design language can be a programming language based on the object-oriented paradigm. An exemplary programming language based on the object-oriented paradigm is Java.

The description or specification of each UDM Design Vector should include hardware and software aspects or features. Thus, the design description or specification of each UDM Design Vector should be sufficiently complete to enable validation and verification against any design specifications that flows down to Tier 2 210 from Tier 1 205 of the Unified Design Methodology 200.

FIGS. 3B, 3C, and 3D together show an exemplary UDM Design Vector being implemented as a Java class. It should be noted that Javadoc comments are employed in the figures to further describe the UDM Design Vector. In one embodiment, the UDM Design Vector could include Class Name (i.e., name of the Java class that implements the exemplary UDM Design Vector), Design Vector Attributes, Variable Definitions, and Methods.

FIG. 3B shows an exemplary set of Design Vector Attributes 230, including Vector Name 235, Vector Type 240, and Parent Application Syntax 245. Vector Name 235 usually is the same as Class Name. Vector Type 240 can be used to indicate whether the vector is a Functional Vector or an Interconnect Vector. Parent Application Syntax name 245 is generally the Name of the Parent Vector.

FIG. 3C shows exemplary variables definitions 250 including Header 255 and Trailer 260 binding information. In one embodiment, the Header binding information 255 can include definitions of input variables and the name of the source vector generating these input variables. In this embodiment, the Trailer binding information 260 can include definitions of output variables and the name of the destination vector that will absorb these output variables.

FIG. 3D shows exemplary Methods 270 of an exemplary UDM Design Vector, including a Vector constructor method 272, a vectorRun( ) method 274, a vectorInvocation( ) method 276, a getHeaderInput( ) method 278, a sendTrailerOutput( ) method 280, a run( ) method 282, and other Java specific methods used to complete the vector—such as initialize( ), wrapup( ), vectorGet( ), vectorSend( ), vectorWait( ), headerDataReady( ), trailerDataReady( ).

The Vector constructor method 272 is generally called when the vector is first created. When called, the Vector constructor method 272 stores the Vector Attributes 230 (shown in FIG. 3B) and receives the Header and Trailer binding information 255, 260 (shown in FIG. 3C).

The vectorRun( ) method 274 can generally be invoked to perform the vector function. The vectorInvocation( ) method 276 generally contains the invocation and temporal information and waits until these requirements are satisfied. The getHeaderInput( ) method 278 can be used to obtain the Header binding information 255 (shown in FIG. 3C). The sendTrailerOutput( ) method 280 can be used to send the trailer variables to the bound vector that consumes the Trailer. The run( ) method 282 should exist in each Java thread and should be executed automatically when the Java thread is created.

Two exemplary types of UDM Design Vectors in accordance with one embodiment of the present invention were shown on FIG. 1A. The UDM Design Vectors are the most basic building blocks with which the terminal architectural model can be constructed. As shown in FIG. 1A, the two exemplary types of UDM vectors include Functional Vectors 286 and Interconnect Vectors 284. In one embodiment, each Functional Vector 286 can be dedicated to performing a single function of transforming the input variables into the output variables as described in the run( ) method 282 (shown in FIG. 3D). It should be noted that Functional Vectors 286 could be restricted to receive their input variables from a single Interconnect Vector and deliver their output variables to a single Interconnect Vector.

In one embodiment, Interconnect Vectors 284 can be used to provide the interconnectivity between Functional Vectors 286. Each Interconnect Vector 284 can typically perform the functions required to contain and transport shared and global variables between Functional Vectors 286. If an Interconnect Vector 284 interconnects two Functional Vectors 286, variables exchanged between the two Functional Vectors 286 are shared variables. If an interconnect vector transports variables between more than two Functional Vectors 286, the transported variables are global variables.

As previously stated, FIG. 1B shows an exemplary Terminal Architectural model 290 that is expressed in terms of a set of interconnected Functional Vectors 292 in accordance with one embodiment of the present invention. Interconnect Vectors 294 are used to link or interconnect the Functional Vectors 292. As previously stated, Interconnect Vectors 294 and Functional Vectors 292 represent the lowest level of building blocks that will be used in building the terminal Architectural model.

Turning to FIG. 2, Tier 2 of the Unified Design Methodology could include the following activities or phases: intra-application-syntax (Intra-AS) concurrency analysis, model atomization, encapsulated functional vector creation, Architectural model test and verification, functional vector extraction, interconnect vector extraction, conjugate virtual machine (CVM) generation.

In one embodiment, the UDM adopts and utilizes the Ptolemy environment. The Ptolemy environment is generally a set of Java packages supporting heterogeneous, concurrent modeling and design. In this embodiment, activities performed in Tier 2 could include Out-Of-Ptolemy testing.

During Intra-AS Concurrency analysis, the application model of an Application Syntax can be analyzed to determine concurrency of execution among the various actors contained in the Application Syntax. The Application Syntax is also rearranged (possibly by replacing portions of the model with actors from the Tier 2 library) to form the actors that will ultimately become UDM vectors. The application model can be annotated with the following attributes: (1) invocation period, denoted $P_{asj}$; and (2) maximum allowable response time, denoted $R_{asj}$.

As such, the top-level composite actor of the Application Syntax could contain the two parameters to represent the invocation period ($P_{asj}$) and the maximum allowed response time ($R_{asj}$). Tier 2 Library should be searched to determine whether one or more vectors that would partially or completely satisfy the requirements of the Application Syntax. If there are any vectors that partially or completely satisfy the requirements of the Application Syntax, these vectors from the Tier 2 Library should replace the portions of the Application Syntax that process the satisfied requirements.

Furthermore, new actors (composite or atomic) that are within the application model and that do not exist in the Tier 2 Library should be provided with two extra parameters similar to the top-level composite actor. In addition, these new actors should be instrumented to capture the list of invoked actors, the order of invocation for each actor, and the interconnection dependencies between actors. The Application Syntax containing the instrumented actors could then be operated for several timing epochs. The timing and instrumentation data can be collected and analyzed to perform Intra-AS concurrency analysis.

It should be noted that Intra-AS concurrency analysis can depend heavily on the functionality of the Application Syntax, and are therefore usually performed by the Application Syntax engineer or component engineer.

Figure 4:
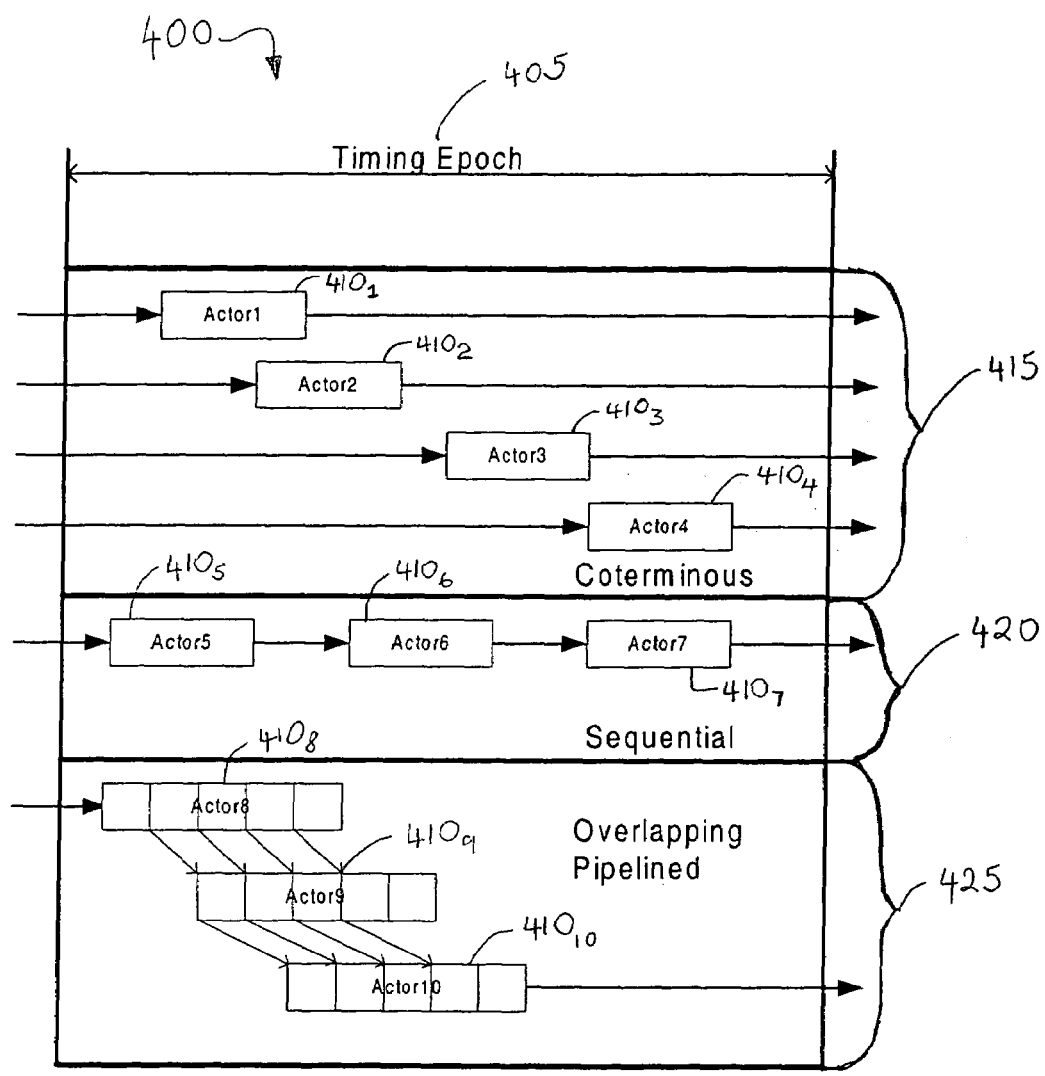
FIG. 4 illustrates an exemplary Intra-AS concurrency analysis in accordance with one embodiment of the present invention.

FIG. 4 illustrates an exemplary Intra-AS concurrency analysis 400 in accordance with one embodiment of the present invention. As shown in the figure, invoked actors should be arranged for a timing epoch 405 by order of invocation. The order of invocation of the actors $410_1$, $410_2$, . . . , $410_{10}$ could be analyzed to determine the invocation type, including coterminous invocation 415, sequential invocation 420, and overlapping pipelined invocation 425.

A coterminous invocation 415 is generally a scenario or situation in which several actors are independently invoked. In the coterminous invocation scenario 415, invoked actors $410_1$, $410_2$, . . . , $410_4$ should complete their processing before the end of the timing epoch in which they execute. Furthermore, the maximum response time for each of these actors $410_1$, $410_2$, . . . , $410_4$ should be the same as the timing epoch.

A sequential invocation 420 is generally a scenario or situation in which several actors are sequentially invoked such that the output data from the first actor is input to the second actor and so on. In the sequential invocation scenario 420, each invoked actor $410_5$, $410_6$, $410_7$ should wait for the output of the previous actor before it can start its execution. The maximum response time for each actor $410_5$, $410_6$, $410_7$ could be determined by subdividing the epoch time among all the actors that are invoked sequentially.

An overlapping pipelined invocation 420 is generally a scenario or situation in which several actors are invoked in a staggered manner. In the overlapping pipelined invocation scenario 420, each actor $410_8$, $410_9$, $410_{10}$ could start its processing after receiving a subset of its input variables from a preceding actor. Hence, it is possible that some actors $410_8$, $410_9$, $410_{10}$ would be operating concurrently.

It should be noted that ten (10) actors are shown in FIG. 4 merely for demonstrative purposes. In practice, the number of actors could be more or less than ten (10).

During the Intra-AS concurrency analysis, certain information for each actor should be identified. The identified information should include the invocation period ($P_{acj}$,) representing the amount of time between two successive invocations of the Application Syntax. When the invocation period is variable, the worst-case period should be used (usually the smallest time).

The identified information should also include the maximum allowable response time ($R_{acj}$,) representing the maximum amount of time in which the Application Syntax should complete its processing. For coterminous invocation 415, the maximum response time of an actor should be less than or equals to the invocation period of the actor (i.e., $R_{acj} \leq P_{acj}$).

For sequential invocation 420 and overlapping pipelined invocation 425, the actor maximum response time should be determined as follows:

For each actor, the required number of JVM instruction cycles can be specified as a variable, $C_{acj}$.

Assume that the number of actors having a common invocation period ($P_{acc}$) is m, the number of JVM instruction cycles of each actor would be represented by $C_{ac1}, C_{ac2}, \ldots, C_{acm}$, respectively The maximum response time for the actor j will be apportioned from the timing epoch according to the following equation (1):

$$R_{acj} \leq P_{acc} * C_{acj}/(C_{ac1}+C_{ac2}+ \ldots +C_{acm}) \qquad (1)$$

Once concurrency has been determined, the Application Syntax should be re-arranged into actors that will eventually become the UDM vectors. If a composite actor contains multiple actors that will become multiple UDM vectors, the composite actor should be replaced with its contents. If a group of actors becomes a single functional vector, this group of actors should be combined into a single composite actor The output from the Intra-AS concurrency analysis phase could include the application model that incorporates the actors (composite or atomic) would become UDM functional vectors. Each of the Actors should be annotated with a respective invocation period and maximum response time.

During Intra-AS concurrency analysis, the Application Syntax has been rearranged so that the top level of the Application Syntax consists of actors (composite or atomic) that will eventually become UDM functional vectors. During model atomization, the actors in the Application Syntax are generally converted into the application-specific Java code that would ultimately become the run methods in the UDM vectors.

The input to the model atomization phase could include an Application Syntax that is generated by Intra-AS concurrency analysis and generally constructed from actors (atomic or composite) that will end up being the UDM functional vectors for the Application Syntax.

During model atomization, the Application Syntax is generally transformed into a single composite actor that is internally structured from interconnected atomic actors. In one embodiment, during the transformation of the single composite actor, Finite State Machine (FSM) actors written XML are transformed into atomic actors written in Java. Furthermore in this embodiment, composite actors written in XML are transformed into atomic actors written in Java. In transforming composite actors into atomic actors, new atomic actors are created such that the new atomic actors would have the same functionality as corresponding composite actors.

It should be noted that in an FSM design vector, the processing associated with the design vector could be described in terms of processing state. In addition, the interactions could be described in terms of state transitions. In general, each state is described in terms of the input that will cause the FSM to transition to a specific state and the outputs the FSM will generate while in that state.

In addition, polymorphism and parameters are removed during model atomization. Parameters are removed during model atomization to make an actor product specific. In one embodiment, parameters could be removed by converting the parameters to private data constants inside the Java code. Data polymorphism is removed during model atomization to make an actor product specific. In one embodiment, data polymorphism could be removed by modifying code to process the actual type of data that the actor will process. Domain polymorphism is also removed during model atomization. It should be noted that once the Application Syntax has been converted into a set of application-specific or product-specific atomic actors, some testing should be done on the Application Syntax.

Figure 5A:
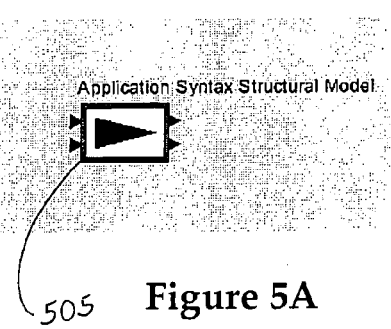
FIG. 5A shows an exemplary composite actor representing an Application Syntax in accordance with one embodiment of the present invention.
Figure 5B:
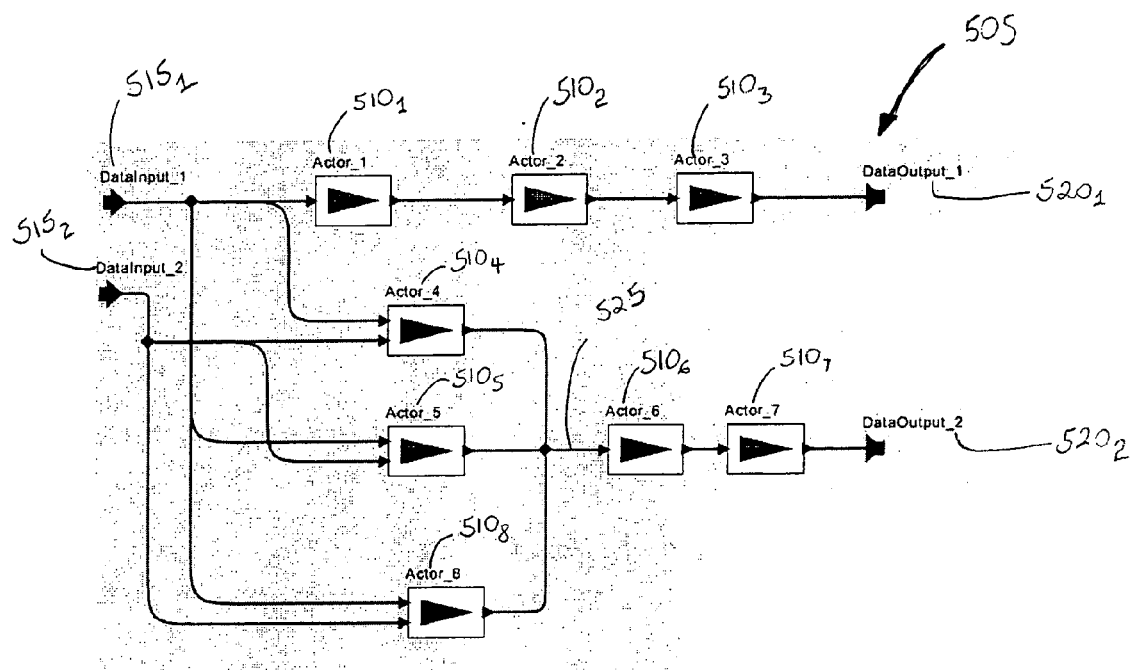
FIG. 5B shows the exemplary composite actor of FIG. 5A as being made up of exemplary atomized or atomic actors in accordance with one embodiment of the present invention.

FIGS. 5A and 5B illustrate an exemplary output from model atomization in accordance with one embodiment of the present invention. FIG. 5A shows an exemplary composite actor 505 representing an Application Syntax in accordance with one embodiment of the present invention. FIG. 5B shows the exemplary composite actor 505 of FIG. 5A as being made up of exemplary atomized or atomic actors $510_1, 510_2, \ldots, 510_8$ in accordance with one embodiment of the present invention.

As shown in FIG. 5B, the exemplary composite actor 505 has two inputs (DataInput_1 $515_1$ and DataInput_2 $515_2$) and two outputs (DataOutput_1 $520_1$ and DataOutput_2 $520_2$). Furthermore, the exemplary composite actor is internally composed of eight (8) atomized or atomic actors $510_1, 510_2, \ldots, 510_8$, which are labeled Actor_1 $510_1$ through Actor_8 $510_8$. Actor_1 $510_1$, Actor_2 $510_2$, and Actor_3 $510_3$ are fed by DataInput_1 $515_1$ and execute sequentially. Actor_4 $510_4$, Actor_5 $510_5$, and Actor_8 $510_8$ are co-terminus. The output 525 of Actor_4 $510_4$, Actor_5 $510_5$, and Actor_8 $510_8$ is fed to Actor_6 $510_6$ and Actor_7 $510_7$. Actor_6 $510_6$ and Actor_7 $510_7$ are executed sequentially.

It should be noted that FIG. 5B shows that composite actor 505 is composed of eight (8) atomized actors merely for demonstrative purposes. In practice, composite actor 505 could be composed of more or less than eight (8) atomized actors.

Encapsulated functional vector creation generally involves putting the atomic actors, generated from model atomization, into UDM Vector format. In one embodiment, encapsulated functional vector creation also includes creating a wrap around each vector that allows it to be executed in the Ptolemy environment. The input into the encapsulated function vector creation phase could include atomic actors from within the atomized Application Syntax.

During encapsulated functional vector creation, atomic actors are generally converted into UDM vector format. First, an empty UDM vector is created using the name of the actor as the name of the vector. The fire( ) method is then put into the vectorRun( ) method of the UDM vector. Next, the Header data of the UDM vector is created with variables containing data input to the vector. The Trailer data of the UDM vector will then be created with variables containing data output from the vector. Additionally, binding methods getHeaderInput( ) and sendTrailerOutput( ) are created to bind the UDM vector with its interconnect vectors. Furthermore, the invocation method of the UDM vector and data associated with the invocation method will be created to contain the temporal information of the vector.

During encapsulated functional vector creation, an encapsulation actor will be created to generate a new instantiation of the newly created UDM vector. First, a blank actor extending the UDM vector is created. Then, a new instance of the vector is created in the initialize( ) method of the vector. In the fire( ) method, the processing actions are added to retrieve input data from input ports, to pass the retrieved input data to the vector, to call the run( ) method of the vector, and to send output data from the vector through the output ports.

The output from the encapsulated functional vector creation phase could include the following a single composite actor representing the Application Syntax. The output from the encapsulated functional vector creation phase could also include atomic actors, representing the single composite actor and the Application. The atomic actors would have been restructured to contain an encapsulated UDM vector description. In one embodiment, the UDM vector can be described in Java.

Architectural model test and verification involves the testing and verification of the atomized model containing encapsulated UDM Functional Vectors against the Application Syntax. The testing and verification can be performed at two levels, including the Application Syntax Level and the Terminal Level The input to the Architectural model test and modification phase can include the atomized Application Syntax with encapsulated Functional Vectors as Ptolemy atomic actors, and the test-bench for the tested Application Syntax with associated test suite and model testing/verification results.

Figure 6:
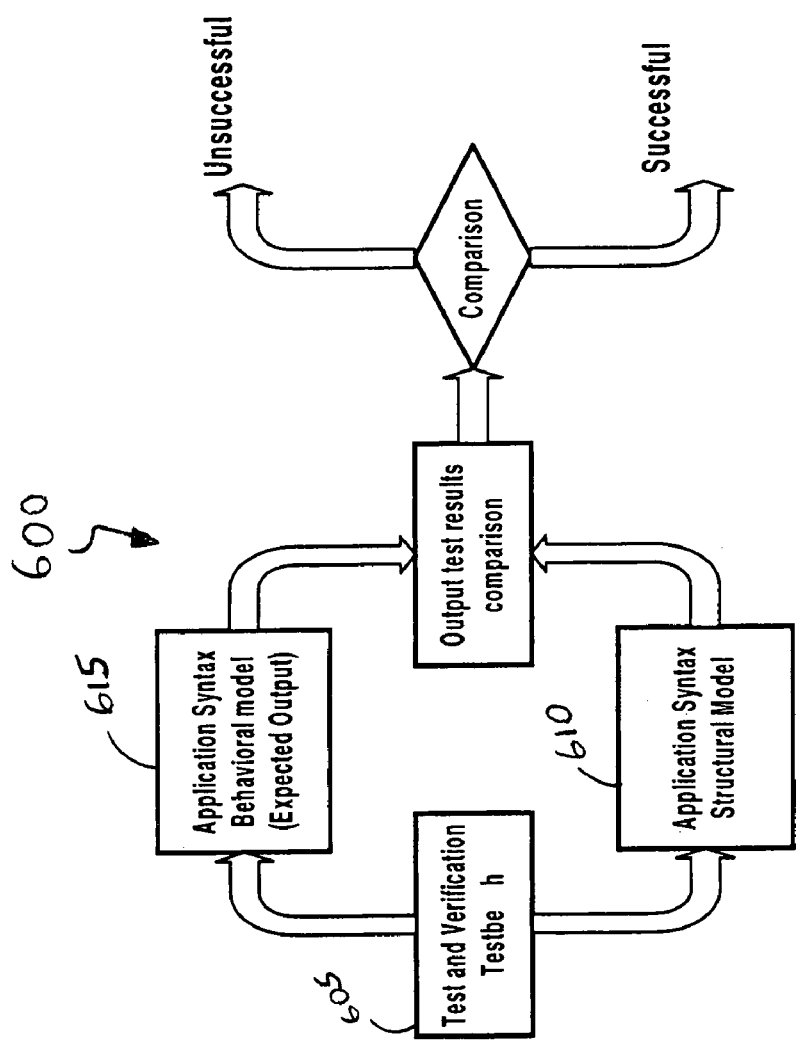
FIG. 6 illustrates an exemplary process flow of the test and verification at the Application Syntax level in accordance with one embodiment of the present invention.

FIG. 6 illustrates an exemplary process flow 600 of the test and verification at the Application Syntax level in accordance with one embodiment of the present invention. During the testing and verification at the Application Syntax level, the Application Syntax test-bench 605 could be modified to provide the following capabilities:

Providing input stimulation for the Architectural model 610 and the application model 615.

Providing the capability to capture the output from the Architectural model 610 and the application model 615.

Providing the capability to compare the output of the Architectural model 610 against the output of the application model 615. In the comparison, the output of the application model 615 will be used as the reference or expected output against which the output of the Architectural model 610 is to be compared.

The testing and verification of the Architectural model can generally be conducted in accordance to the following description. First, the Application Syntax test-bench 605 is used to provide input to the application model 615. The output from the application model 615 is captured as the expected output. Furthermore, the Application Syntax test-bench 605 is used to provide the same input to the Architectural model 610, and to capture output from the Architectural model 610. In addition, the comparison function of the Application Syntax test-bench is used to compare the output from the application model 615 and the output from the Architectural model 610. If the output from the application model 615 were identical to the output from the Architectural model 610, the Architectural model 610 could be declared as being successfully tested and verified.

If the output from the application model 615 were different from the output from the Architectural model 610, the Architectural model 610 would be marked as unsuccessfully tested and verified, and would need to be debugged and corrected.

The terminal level testing and verification of the Architectural model uses the same steps as shown in FIG. 6 with the following changes:

Use the terminal application model instead of the Application Syntax application model.

Construct a new terminal model in which the model of the Application Syntax to be verified is replaced with the Architectural model that was generated during encapsulated functional vector creation.

Use the model test/verification test-bench and test suite to conduct the verification.

Conduct the verification in the same manner as the Application Syntax level.

The output from the Architectural model test and verification phase could include (1) the Architectural model test and verification test suite, and (2) the success or failure of the test and verification of the Architectural model against the application model.

Functional vector extraction generally involves the extraction of the Java source code for the UDM Functional Vector from the encapsulated actors. The resulting Java code should be similar to the UDM vector definition as shown in FIGS. 3A, 3B, 3C, and 3D, and described in the text accompanying the figures.

The input to the functional vector extraction phase could include the Java source code of the encapsulated functional vector that was created in the encapsulated functional vector creation and that was tested during the Architectural model test and verification phase.

Functional vector extraction generally includes extracting the Functional Vector Java source from the encapsulated Functional UDM Vector, and creating initialization code for the Application Syntax to instantiate the UDM vector classes inside the Application Syntax. The output from the functional vector extraction phase could include Java source code for Functional UDM Vectors identified as part of the Application Syntax, and initialization code for the Application Syntax.

Interconnect vector extraction generally involves the construction of the Java source code for the UDM interconnect vectors from the interconnectivity of the encapsulated atomic actors within the Application Syntax Architectural model. The resulting Java code should be similar to the UDM vector definition as shown in FIGS. 3A, 3B, 3C, and 3D, and described in the text accompanying the figures.

The input to the interconnect vector extraction phase could include the atomized composite actor 505, the atomic actors 510$_1$, 510$_2$, . . . , 510$_8$, and the interconnectivity links and relationships, as shown in FIGS. 5A and 5B and described in the text accompanying the figures. The input to the interconnect vector extraction phase could also include the output of the encapsulated functional vector creation following the successful testing and verification of the Architectural model.

Interconnect vector extraction could include processing the XML structure of the atomized composite actors that contain the created Functional UDM Vectors. Interconnect vector extraction can also include generating the Java source for the interconnect vector. Examples of Java source are shown in FIGS. 3B, 3C, and 3D, and described in the text accompanying the figures. The VectorRun( ) method of the interconnect vector should be generated to contain the processing required for any buffering and protocols needed for the transportation of the shared or global variables that are being handled by the interconnect vector.

In addition, the binding data of the interconnect vector could be defined as follows:

Regarding Shared or Global variable definition, it should be noted that a UDM interconnect vector does not perform any transformation on the input variable to generate the output variables.

The header of the interconnect vector generally contains the names of the Functional UDM Vectors that generate the variables input into this vector.

The trailer of the interconnect vector generally contains the names of the Functional Vectors that receives the variables.

The invocation information for the interconnect vector should be the same as the invocation for any of the functional vectors that are attached to its inputs The output from the interconnect vector extraction phase could include the Java source code for all the UDM interconnect vectors that had been a part of the Application Syntax.

Conjugate Virtual Machine (CVM) generation involves the extraction of the Conjugate Virtual Machine (CVM) instructions and other related information for each of the extracted UDM vectors obtained during functional vector extraction and interconnect vector extraction.

The input to the CVM generation phase could include the Java source for the UDM vectors that were obtained during functional vector extraction and interconnect vector extraction. The input to the CVM generation phase could also include the Temporal Information and the Maximum expected response time procured from the Intra-AS concurrency analysis During CVM generation, a Java compiler is used to compile the UDM vector class into byte code. The compiled byte code of the UDM VectorRun( ) method is transformed to generate a list of JVM instructions. This generated list of JVM instructions would constitute a new CVM if certain conditions were met. First, if the generated instructions list covers a substantially small subset of JVM instructions, the generated instructions list would constitute a new CVM. On the other hand, if the generated instructions list covers a substantially large subset of JVM instructions, the CVM can be replaced with the full JVM. Second, if the generated instructions list does not match any pre-generated CVM, the generated instructions list would constitute a new CVM. On the other hand, if generated instructions list matches a pre-generated CVM, the matched CVM would be assigned to the UDM vector.

For each CVM, the following data has be to extracted through analysis of the compiled byte code:

UDM Memory requirements, including code space, local data space, and heap or stack space.

Minimum expected CVM execution speed—This number can be generated using the UDM vector maximum response time assigned to the vector during the Intra-AS concurrency analysis.

The output from CVM generation could include the CVM definition as a subset of the JVM. This CVM definition should be a detailed description of the CVM ISA (Instruction Set Architecture). The output from CVM generation could also include the minimum expected CVM instruction execution speed, and the UDM vector memory requirements.

As previously stated, the UDM adopts and utilizes the Ptolemy environment in one embodiment. In this embodiment, activities performed in Tier 2 could include Out-of-Ptolemy testing. Out-of-Ptolemy testing involves the standalone testing of the extracted UDM vectors outside of the Ptolemy environment. During the out-of-Ptolemy testing, the UDM vectors are compiled as Java threads, and the overall Architectural model of the application is built out of the set of UDM vectors. The resulting Architectural model can operate as a Java application on any Java platform. The Architectural model should be tested and verified against the application model. Furthermore, measurements for the number of JVM cycles should be extracted from the Architectural model.

The input to the out-of-Ptolemy testing phase could include the Java sources for the UDM vectors extracted during the functional vector extraction and the interconnect vector extraction. The input to the out-of-Ptolemy testing phase could also include the tested application model, the associated testing suite, and the testing results.

During out-of-Ptolemy testing, a standalone Java application is constructed using the Java sources of the extracted UDM vectors. The standalone application could be compiled for a targeted JVM platform. The JVM instruction cycles (denoted C) required for the execution of each UDM vectorRun( ) method should be extracted.

Furthermore during out-of-Ptolemy testing, a test-bench should be created to provide input simulation into the standalone application and to capture output from the standalone Java application. In addition, the test-bench should include a test executive to support the operation of the test-bench and to execute the application's test suite. The test-bench should also include output data comparison with previously captured output from the application model.

It should be noted that the Java standalone application could operate on any JVM platform using the developed test-bench. It should also be noted that because of the Java platform speed limitation, the standalone Java application would most likely not execute at real time speed.

In general, the test-bench should be used to test and verify the standalone Java application against the application model. If the testing and verification fail, the Architectural model and the standalone Java application should be modified and rebuilt starting at the intra-AS concurrency analysis phase. The process of testing and rebuilding should be repeated until the standalone Java application, as well as the Architectural model, could be successfully verified.

After successful verification, the model is further operated for several timing epochs as needed to extract the number of JVM execution cycles for the following items:

For each Functional Vector (denoted $C_{fv}$), $C_{fv}$ is to be used in place of $C_{ac}$ in the formula for the identification of the functional vector Maximum Expected Response Time procured during intra-AS concurrency analysis.

From the Architectural model, the JVM cycles, denoted $C_{as}$, can be calculated. $C_{as}$ could be used to determine of the Maximum Expected Response Time of the Application Syntax.

The output from the Out-of-Ptolemy testing phase could include a Architectural model made from a compiled Java application of the set of UDM vectors implemented as Java concurrent threads. The output from the Out-of-Ptolemy testing phase could also include a test-bench for testing and verification of the Architectural model against the application model. The output from the Out-of-Ptolemy testing phase could further include the success or failure of testing the Architectural model against the application model. Additionally, the output from the Out-of-Ptolemy testing phase could include the number of JVM cycles needed ($C_{fv}$ and $C_{as}$, respectively).

Turning to FIG. 2, in Tier 3 215 of the Unified Design Methodology 200, Design Vectors 100 (shown in FIG. 2) are generally parsed and analyzed so that system design aspects or features can be mapped into specific hardware and software objects or elements.

In Tier 3 215, the hardware specifications and constraints of the preferred hardware platform can be superimposed on the output of Tier 2 210 to map designs of Vectors into detail designs of hardware and software objects or elements. Tier 3 215 is supported by an Implementation Components Library 230 containing detailed design of the Implementation Components that generally includes detailed designs of constituent elements of a Scaled Virtual Machine. Examples of constituent elements of the Scaled Virtual Machine may include instruction set primitives such as adder, multiplier, shifter, etc. The Implementation Components of Tier 3 115 can be expressed in the same design language used in Tier 1 205 and Tier 2 210.

Depending on the superimposed preferred hardware platform specifications and constraints, each Implementation Component can be mapped into specific hardware and software objects or elements in one of the following three ways. The Implementation Component can be substituted with an equivalent Component of the preferred hardware platform. In addition, the Implementation Component can be instantiated as a hardware element. Furthermore, the Implementation Component can be emulated using the Component of the preferred platform. Mapping of Implementation Components into one of three aforementioned ways is the general objective of Tier 3 215.

During the mapping process, data records generated in Tier 2 210 to describe interconnected Vectors are analyzed against the specifications and constraints of the preferred platform. Fields 105, 110, 115, 120, 125 in each Vector 100 (shown in FIG. 3A) are examined. Furthermore, design aspects or features of each Vector can be assigned to the preferred platform hardware, a supplementary hardware supporting the preferred platform, or software that will execute on the preferred hardware platform or the supplementary hardware supporting the preferred platform.

Generally if the Temporal or Timing Specification and the instruction set required to support each Vector are compatible with the capabilities of the preferred hardware platform, a collection of Vectors can be fused or grouped together and executed on one of the processing elements of the preferred hardware platform. In such a case, the Implementation Components of the fused or grouped Vectors can be substituted by the equivalent Implementation Components of the preferred hardware platform or emulated using the Implementation Components of the preferred platform. However if the Temporal or Timing Specification or the instruction set required to support a Vector prohibits direct mapping or emulation of the Vector to the preferred hardware platform, the Scaled Virtual Machine of the Vector would be mapped or allocated to hardware and software elements supplementing the preferred platform.

Accordingly at the end of the mapping process, the design of each Vector can be mapped or allocated to specific hardware and/or software objects or elements. The specifications of the preferred platform together with the description of the supplementary hardware elements will typically describe the system hardware required to run the system software objects or elements.

Re-configurable Hardware Platforms are being sought by designers looking to bridge the gap between general-purpose processors and custom integrated circuits (logic) implementations. The Unified Design Methodology 200 generally enables the de-coupling of the application from specific implementation architectures. Using the Methodology 200, the system designer can design the architecture for a particular application then superimpose that architecture on a target re-configurable hardware platform. As such, the Unified Design Methodology 200 can be an effective tool for targeting re-configurable hardware platform.

The Unified Design Methodology 200 can be applied in several different ways depending upon the type and capabilities of the target re-configurable hardware platform. To better address that point, a general description of various domains of re-configurable hardware platforms will be provided below.

Figure 7:
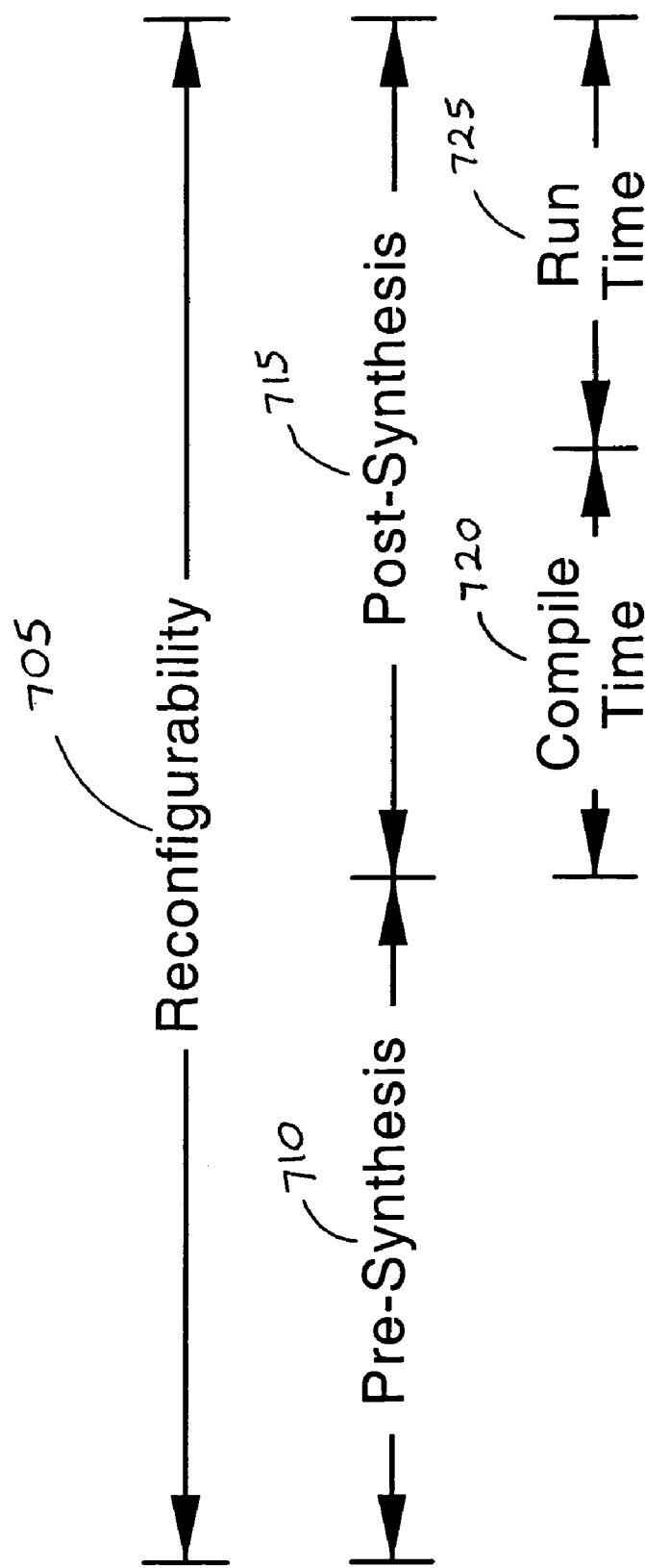
FIG. 7 generally illustrates various exemplary domains of re-configurable hardware platforms in accordance with one embodiment of the present invention.

FIG. 7 generally illustrates various exemplary domains of re-configurable hardware platforms 705 in accordance with one embodiment of the present invention. The exemplary domains of re-configurable hardware platforms 705 could include platforms that are re-configurable in the Pre-Synthesis domain 710, and platforms that are re-configurable in the Post-Synthesis domain 715.

Regarding a re-configurable platform in the Pre-Synthesis domain 710, elements of the platform are generally pre-designed within an architectural context that allows the elements to be readily integrated into the platform architecture and/or modified to fulfill a set of specified processing requirements. After the platform is configured in the Pre-Synthesis domain 710, it is transformed through a physical realization process into actual hardware.

Returning to FIG. 2, the Unified Design Methodology 200 generally provides a mechanism in Tier 3 215 to incorporate the attributes and capabilities of a platform in mapping the design information included in the Conjugate Virtual Machine field 115 (shown in FIG. 3A) onto the platform objects or elements. In doing so, the Unified Design Methodology 200 can be compatible with platforms that can be re-configured in the Pre-Synthesis domain 710 (shown in FIG. 7).

Returning to FIG. 7, platforms that are re-configurable in the Post-Synthesis domain 715 are generally designed to allow some attributes and capabilities of the hardware to be re-configurable in the Post-Synthesis domain 715. In other words, objects or elements of a Post-Synthesis Re-Configurable Platform offers certain degree of variability that can be utilized in some cases only at compile-time 720 and in other cases at run-time 725.

Accordingly, the capabilities of a re-configurable platform in Post-Synthesis domain 715 can be adjusted to match the processing needs of specific applications while benefiting from the production volume advantages realized when the platform is used in multiple applications. The flexibility of re-configurable platforms in the Post-Synthesis domain 715 can allow the platforms to be used in applications requiring compatibility with multiple (communications) standards.

Returning to FIG. 2, the Unified Design Methodology 200 generally provides a mechanism in Tier 3 215 to use the Conjugate Virtual Machine field 115 of Vector design data records 100 (shown in FIG. 3A) to specify hardware attributes and capabilities required to support each Vector. In other words, the Conjugate Virtual Machine field 115 of each Vector can be used to specify the features and capabilities that a Post-Synthesis Re-Configurable platform needs to satisfy in order to support each Vector. Accordingly, the Unified Design Methodology 200 can be compatible with platforms that can be re-configured in the Post-Synthesis domain 715 (shown in FIG. 7).

Returning to FIG. 7, re-configurable platforms in the Post-Synthesis domain 715 can be further divided into platforms that can be re-configured at compile-time 720 and platforms that can be re-configured at run-time 725. Several emerging Post-Synthesis re-configurable platforms are based on Field Programmable Gate Arrays (FPGA) and Programmable Logic Devices (PLD). These FPGA-based and PLD-based platforms can be re-configured at compile time.

The Conjugate Virtual Machine field 115 in each Vector 200 (shown in FIG. 3A) can be used by a platform-specific compiler to generate description of the logic, the placement, and the routing information in a format that can be used to directly re-configure the platform. The remaining design aspects contained in the Design Vectors 100 can be mapped into software that is compiled separately to run on the re-configured platform.

The attributes of a Run-time Re-configurable Platform are usually altered parametrically, i.e., through downloading of new values for a set of re-programmable parameters. Tier 3 215 of the disclosed Unified Design Methodology 200 (shown in FIG. 2) enables incorporation of the preferred platform capabilities and attributes including the flexible adjustments of features and capabilities of the platform by re-configuring hardware parameters. Tier 3 215 takes into account such flexible adjustments of features and capabilities by mapping the Conjugate Virtual Machine field 115 of each Vector 100 (shown in FIG. 3A) onto the preferred hardware platform and then generating appropriate values for the re-programmable parameters.

In short, the Conjugate Virtual Machine field 115 in each Vector 100 (shown in FIG. 3A) generally allows the Unified Design Methodology 200 (shown in FIG. 2) to address a plurality of ways to realize the system hardware. In Pre-Synthesis domain 710, the Conjugate Virtual Machine field 115 can be mapped onto pre-designed elements of a target re-configurable platform. In the Post-Synthesis domain 715, the Conjugate Virtual Machine field 115 can be used to generate the configuration parameters of the target re-configurable platform.

It should be noted that the functional components illustrated in the above-referenced figures and discussed above could be implemented in hardware or software. If the aforementioned functional components are implemented in software, these components can be stored on a computer-readable medium, such as floppy disk, hard drive, CD-ROM, DVD, tape, memory, or any storage device that is accessible by a computer.

While certain exemplary embodiments have been described and shown in accompanying drawings, it is to be understood that such embodiments are merely illustrative of and not restrictive on the broad invention, and that the invention not be limited to the specific constructions and arrangements shown and described, since various other modifications may occur to those ordinarily skilled in the art.

What is claimed is:

1. A method to efficiently design and implement a matched instruction set processor system, including:
    decomposing the matched instruction set processor system into interconnected design vectors, each of the interconnected design vectors including a binding header method, a run method, a conjugate virtual machine (CVM), a binding trailer method, and an invocation method; and
    analyzing and mapping the interconnected design vectors into a re-configurable platform.

2. The method of claim 1, wherein analyzing and mapping the interconnected design vectors includes:

mapping the interconnected design vectors into a pre-synthesis re-configurable platform.

3. The method of claim 2, wherein analyzing and mapping the interconnected design vectors includes:
transforming the pre-synthesis re-configurable platform into actual hardware through a physical realization process.

4. The method of claim 1, wherein analyzing and mapping the interconnected design vectors includes:
mapping the interconnected design vectors into a post-synthesis re-configurable platform.

5. The method of claim 4, wherein mapping the interconnected design vectors includes:
configuring the post-synthesis re-configurable platform at compile-time to match processing requirements of specific applications.

6. The method of claim 5, wherein configuring the post-synthesis re-configurable platform at compile-time includes:
using the CVM of each interconnected design vector to specify required attributes and capabilities; and
configuring the post-synthesis re-configurable platform at compile-time to match the required attributes.

7. The method of claim 6, wherein configuring the post-synthesis re-configurable platform at compile-time includes:
using the CVM of each interconnected design vector to specify required attributes; and
configuring the post-synthesis re-configurable platform at compile-time to match the required attributes.

8. The method of claim 7, wherein configuring the post-synthesis re-configurable platform at compile-time includes:
using the CVM of each interconnected design vector to specify required attributes, the required attributes including logic, placement, and routing information; and
configuring the post-synthesis re-configurable platform at compile-time to match the required attributes.

9. The method of claim 4, wherein mapping the interconnected design vectors includes:
configuring the post-synthesis re-configurable platform at run-time to match processing requirements of specific applications.

10. The method of claim 9, wherein configuring the post-synthesis re-configurable platform at run-time includes:
using the CVM of each interconnected design vector to specify required attributes; and
configuring the post-synthesis re-configurable platform at run-time to match the required attributes.

11. The method of claim 10, wherein configuring the post-synthesis re-configurable platform at compile-time includes:
using the CVM of each interconnected design vector to specify required attributes, the required attributes including a set of re-programmable parameters having values that can be downloaded and changed at run-time; and
configuring the post-synthesis re-configurable platform at compile-time to match the required attributes.

12. A system to efficiently design and implement a matched instruction set processor system, including:
an architectural modeling unit to decompose the matched instruction set processor system into interconnected design vectors, each of the interconnected design vectors including a binding header method, a run method, a conjugate virtual machine (CVM), a binding trailer method, and an invocation method; and a realization mapping unit operatively coupled to the architectural unit to analyze and map the interconnected design vectors into a re-configurable platform.

13. The system of claim 12, wherein the realization mapping unit maps the interconnected design vectors into a pre-synthesis re-configurable platform.

14. The system of claim 13, wherein the realization mapping unit transforms the pre-synthesis re-configurable platform into actual hardware through a physical realization process.

15. The system of claim 12, wherein the realization mapping unit maps the interconnected design vectors into a post-synthesis re-configurable platform.

16. The system of claim 15, wherein the realization mapping unit configures the post-synthesis re-configurable platform at compile-time to match processing requirements of specific applications.

17. The system of claim 16, wherein the realization mapping unit uses the CVM of each interconnected design vector to specify required attributes and capabilities, and the realization mapping unit configures the post-synthesis re-configurable platform at compile-time to match the required attributes.

18. The system of claim 16, wherein the realization mapping unit uses the CVM of each interconnected design vector to specify required attributes, and the realization mapping unit configures of the post-synthesis re-configurable platform at compile-time to match the required attributes.

19. The system of claim 17, wherein the realization mapping unit uses the CVM of each interconnected design vector to specify required attributes, the required attributes including logic, placement, and routing information, the realization mapping unit configures of the post-synthesis re-configurable platform at compile-time to match the required attributes.

20. The system of claim 15, wherein the realization mapping unit configures the post-synthesis re-configurable platform at run-time to match processing requirements of specific applications.

21. The system of claim 20, wherein the realization mapping unit uses the CVM of each interconnected design vector to specify required attributes, and configures the post-synthesis re-configurable platform at run-time to match the required attributes.

22. The system of claim 21, wherein the realization mapping unit uses the CVM of each interconnected design vector to specify required attributes, the required attributes including a set of re-programmable parameters having values that can be downloaded and changed at run-time, and the realization mapping unit configures the post-synthesis re-configurable platform at compile-time to match the required attributes.

23. A machine-readable medium comprising instructions which, when executed by a machine, cause the machine to perform operations comprising:
decomposing the matched instruction set processor system into interconnected design vectors, each of the interconnected design vectors including a binding header method, a run method, a conjugate virtual machine (CVM), a binding trailer method, and an invocation method; and
analyzing and mapping the interconnected design vectors into a re-configurable platform.

* * * * *